United States Patent
Arndt et al.

(10) Patent No.: US 6,927,469 B2
(45) Date of Patent: Aug. 9, 2005

(54) SURFACE MOUNTABLE LIGHT EMITTING OR RECEIVING DEVICE

(75) Inventors: Karlheinz Arndt, Regensburg (DE); Herbert Brunner, Regensburg (DE); Franz Schellhorn, Regensburg (DE); Günter Waitl, Regensburg (DE)

(73) Assignee: Osram GmbH (DE)

( * ) Notice: Subject to any disclaimer, the term of this patent is extended or adjusted under 35 U.S.C. 154(b) by 0 days.

(21) Appl. No.: 10/173,055

(22) Filed: Jun. 17, 2002

(65) Prior Publication Data

US 2003/0155624 A1 Aug. 21, 2003

Related U.S. Application Data

(63) Continuation of application No. 09/043,840, filed on Nov. 18, 1999, now Pat. No. 6,459,130.

(30) Foreign Application Priority Data

Sep. 29, 1995 (DE) .......................... 195 36 454

(51) Int. Cl.⁷ .................... H01L 33/00; H01L 23/29; H01L 27/14; H01L 23/795; H01L 31/08
(52) U.S. Cl. ...................... 257/432; 257/79; 257/80; 257/81; 257/83; 257/82; 257/84; 257/98; 257/99; 257/100; 257/433; 257/435; 257/436; 257/437; 257/427; 257/787; 257/680; 257/774; 257/666; 257/676
(58) Field of Search .............................. 257/428–436, 257/437, 79–84, 98–100, 787, 666, 774, 680, 676

(56) References Cited

U.S. PATENT DOCUMENTS

| | | | |
|---|---|---|---|
| 3,820,237 A | 6/1974 | Effer | |
| 3,821,775 A | 6/1974 | Biard | |
| 3,914,786 A | 10/1975 | Grossi | |
| 4,255,688 A | 3/1981 | Nagasawa | |
| 4,611,884 A * | 9/1986 | Roberts | 385/44 |
| 4,649,415 A * | 3/1987 | Hebert | 257/668 |
| 4,935,665 A | 6/1990 | Murata | |
| 4,995,695 A * | 2/1991 | Pimpinella et al. | 385/49 |
| 5,158,091 A * | 10/1992 | Butterfield et al. | 600/485 |
| 5,298,768 A | 3/1994 | Okazaki et al. | |
| 5,545,893 A * | 8/1996 | Brown et al. | 250/239 |
| 5,727,009 A * | 3/1998 | Tajiri et al. | 372/43 |
| 5,760,885 A * | 6/1998 | Yokoyama et al. | 356/4.01 |
| 6,055,102 A * | 4/2000 | Park | 359/484 |
| 6,226,082 B1 * | 5/2001 | Roe | 356/301 |
| 6,236,477 B1 * | 5/2001 | Ishihara et al. | 359/640 |

FOREIGN PATENT DOCUMENTS

| | | |
|---|---|---|
| DE | 31 29 996 A1 | 2/1983 |
| DE | 42 32 637 A1 | 3/1994 |
| DE | 42 32 644 A1 | 3/1994 |
| EP | 60261181 | 12/1985 |
| EP | 0 400 176 | 12/1990 |
| EP | 0 521 312 A1 | 1/1993 |
| EP | 0849784 A2 * | 6/1998 |
| JP | 10-70511 * | 3/1998 |

OTHER PUBLICATIONS

"Surface-Mount LED Uses Reflective Plastic", *Machine Design*, Bd. 63, Nr. 5, Mar. 7, 1991, p. 30.
Opto–Semiconductors—LEDs and Displays.
TEMIC Telefunken Semiconductors—Component Construction– p. 30.
Panasonic Human Electronics pp. 1–17.
Siemens Components 28 (1990) p. 254.

* cited by examiner

*Primary Examiner*—Alexander Oscar Williams
(74) *Attorney, Agent, or Firm*—Fish & Richardson P.C.

(57) ABSTRACT

A radiation-emitting and/or radiation-receiving semiconductor component, in which a radiation-emitting and/or radiation-receiving semiconductor chip is secured on a chip carrier part of a lead frame. The chip carrier part forms a trough in the region in which the semiconductor chip is secured wherein the inner surface of the trough is designed in such a way that it constitutes a reflector for the radiation emitted and/or received by the semiconductor chip.

9 Claims, 2 Drawing Sheets

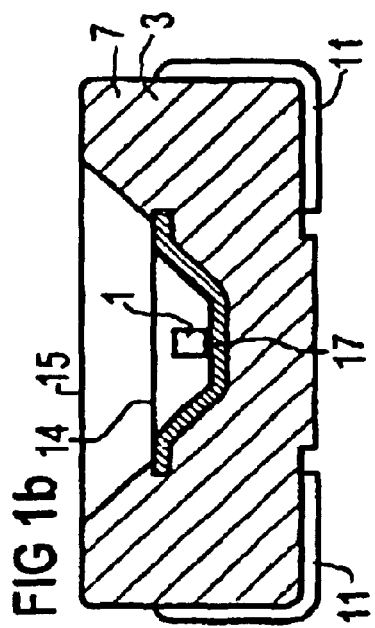
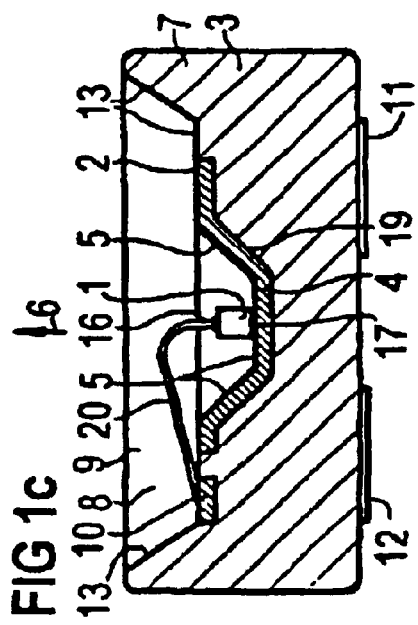
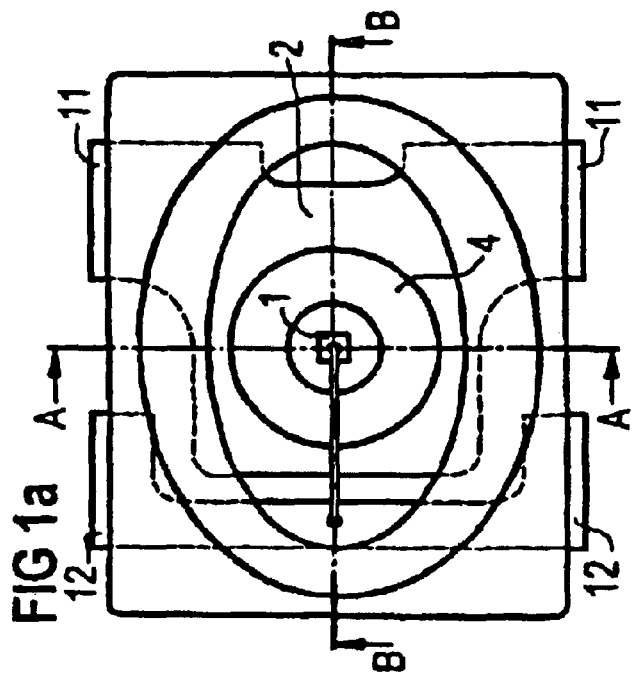

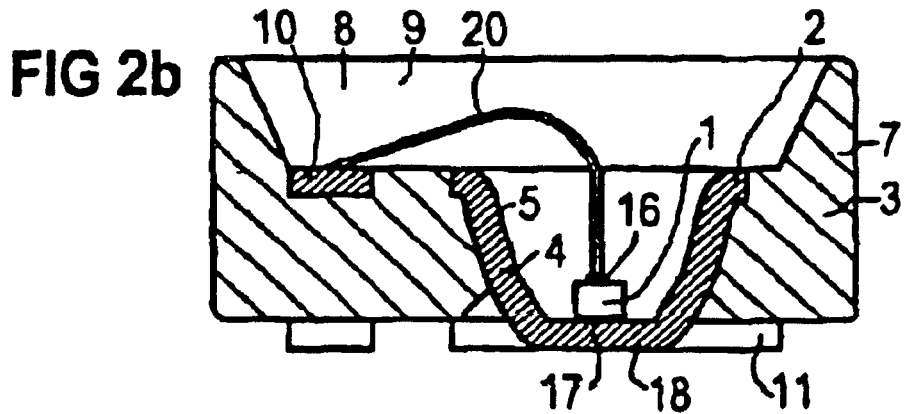
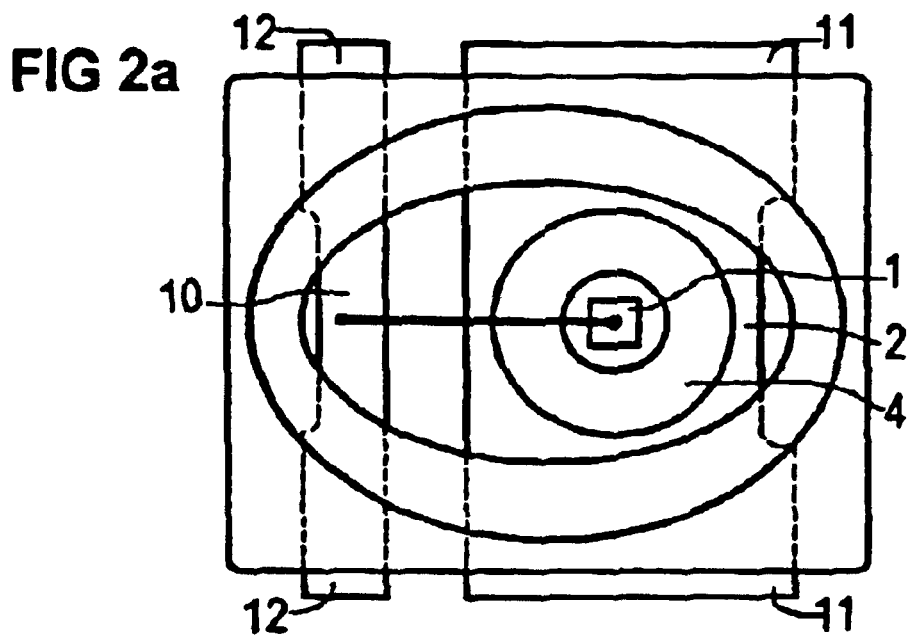
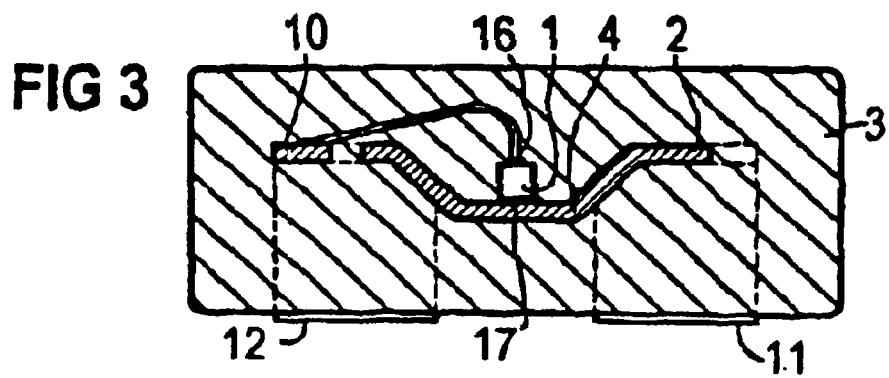

SURFACE MOUNTABLE LIGHT EMITTING OR RECEIVING DEVICE

RELATED APPLICATION DATA

The present application is a continuation of application Ser. No. 09/043,840 filed Nov. 18, 1999, now U.S. Pat. No. 6,459,130, whose disclosure is incorporated by reference in its entirety herein. Application Ser. No. 09/043,840 is the national phase application for PCT/DE96/01730 filed Sep. 13, 1996, which claims priority to DE 195 36 454, filed Sep. 29, 1995.

BACKGROUND OF THE INVENTION

1. Field of the Invention

The present invention relates to a radiation-emitting and/or radiation-receiving semiconductor component in which a radiation-emitting and/or radiation-receiving semiconductor chip is secured on a chip carrier part of a lead frame wherein the semiconductor chip and at least a partial region of the chip carrier part are surrounded by an encapsulation.

2. Description of the Prior Art

Such a semiconductor component is disclosed, for example, in European Patent Application EP 400 176. The latter describes a so-called top LED, in which a semiconductor chip is secured on a planar chip carrier part of a lead frame. The lead frame is composed of the chip carrier part and a connection part, arranged separately from the latter, with a respective external connection.

The chip carrier part includes the semiconductor chip. The connection part and partial regions of the external connections are surrounded by an encapsulation which comprises a radiation-impermeable base body having a recess and a radiation-permeable window part which fills up this recess. The chip carrier part and the connection part are surrounded by the base body, or embedded in the latter, in such a way that partial regions of the upper sides of the chip carrier part and of the connection part are flush with the remaining bottom surface of the recess.

Except for its underside, by which it rests on the chip carrier part, the semiconductor chip is completely surrounded by the radiation-permeable window part. The recess, which is completely filled up by the radiation-permeable window part, is fashioned in such a way that it forms a reflector for the radiation emitted by the semiconductor component.

The present invention is directed to developing a radiation-emitting and/or radiation-receiving semiconductor component of the type mentioned in the introduction in such a way that it has an increased radiant intensity and can be produced in a simple manner. At the same time, this semiconductor component is to have good heat dissipation from the semiconductor chip.

SUMMARY OF THE INVENTION

In an embodiment of the present invention, the chip carrier part forms a trough in the region in which the semiconductor chip is secured. The inner surface of the trough is designed in such a way that it forms a reflector for the radiation which is emitted and/or received by the semiconductor chip. The chip carrier part has at least two external electrical connections which project from the encapsulation at various points thereof.

In an embodiment, the chip carrier part forms a trough in the region in which the semiconductor chip is secured. The inner surface of the trough is designed in such a way that it forms a reflector for the radiation which is emitted and/or received by the semiconductor chip; the trough of the chip carrier part projects at least partially from the encapsulation in such a way that the chip carrier part can be electrically and/or thermally connected in the region of the trough.

In an embodiment, the lead frame has the chip carrier part and a connection part arranged at a distance from the chip carrier part, with two external connections which project from the encapsulation at opposite sides.

In an embodiment, at least some of the inner surfaces of the trough of the chip carrier are coated with a reflection-enhancing material.

In an embodiment, the external connections of the chip carrier part are broader than the external connections of the connection part.

In an embodiment, the encapsulation has a radiation-impermeable base body with a recess and a radiation-permeable window part which is arranged in the recess. The radiation-impermeable base body encapsulates at least a partial region of the chip carrier part in such a way that at least the trough of the chip carrier part is arranged in the recess.

In an embodiment, the upper edge of the trough extends below the upper edge of the recess. The partial region of the inner surface of the recess which is not covered by the trough is designed in such a way that it forms a reflector for the radiation emitted by the semiconductor chip.

In an embodiment, some of the inner surfaces of the recess of the radiation-impermeable base body are coated with a reflection-enhancing material.

DESCRIPTION OF THE DRAWINGS

Additional features and advantages of the present invention are described in, and will be apparent from, the Detailed Description of the Presently Preferred Embodiments and from the Drawings.

FIG. 1*a* is a plan view of an embodiment of a semiconductor component in accordance with the present invention;

FIG. 1*b* is a cross-sectional view of the semiconductor component shown in FIG. 1*a* taken along the line A—A;

FIG. 1*c* is a cross-sectional view of the semiconductor component shown in FIG. 1*a* taken along the line B—B;

FIG. 2*a* is a plan view of another embodiment of the semiconductor component of the present invention;

FIG. 2*b* is a cross-sectional view of the semiconductor component shown in FIG. 2*a* taken along the line C—C; and FIG. 3 is a sectional view through another embodiment of the semiconductor component in accordance with the present invention.

DETAILED DESCRIPTION OF THE PREFERRED EMBODIMENTS

The semiconductor component of FIGS. 1*a* to 1*c* is a so-called top LED which is constructed as a surface-mounted device. It is composed of a metallic lead frame, comprising a chip carrier part 2, a connection part 10, two external connections 11, 12, a radiation-emitting semiconductor chip 1 secured on the chip carrier part 2, and a parallelepipedal encapsulation 3. The semiconductor chip 1 has a contact metallization layer 16 on its top side, and a contact metallization layer 17 on its underside. The contact metallization layer 17 on the underside is electrically conductively connected to the chip carrier part 2, for example, by using a metallic solder or an electrically conductive adhesive, and the contact metallization layer 16 on the top side is electrically conductively connected to the connection part 10 by using a bonding wire 20, which is composed, for example, of gold or another suitable metallic material. A trough 4 is formed, for example, by embossing, in that region of the chip carrier part 2 in which the semiconductor chip 1 is secured, the inner surface 5 of the trough has the approximate shape of an upside-down truncated cone and forms a reflector for the radiation emitted by the semiconductor chip 1. The external connections 11, 12 of the chip carrier part 2 and of the connection part 10 each project from this encapsulation 3 on opposite sides and are bent outside the encapsulation 3 downwards and then inwards towards the centre of the encapsulation 3. However, they can also have any other desired form.

The encapsulation 3 is produced in two parts from a radiation-impermeable base body 7 having a recess 8 and a radiation-permeable window part 9 which fills up this recess 8. The base body 7 and the window part 9 are composed, for example, of a filled synthetic resin or of a thermoplastic and, respectively, of a transparent synthetic resin or polycarbonate. Suitable fillers for synthetic resin are, for example, metal powders, metal oxides, metal carbonates or metal silicates. The chip carrier part 2 and the connection part 10 are surrounded by the radiation-impermeable base body 7, or embedded in the latter, in such a way that a partial region of the connection part 10 and at least that partial region of the chip carrier part 2 in which the trough 4 is situated rest on the bottom surface 19 of the recess 8. The recess 8 has a larger depth than the trough 4, so that the trough 4 is arranged completely within the recess 8 and the inner surface 13 of the recess projects upwards beyond the trough 4.

In a preferred embodiment, the inner surface of the trough 4 and possibly also that part of the top side of the connection part 10 which adjoins the window part 9, are polished or coated with a reflection-enhancing material for the purpose of improving the reflection. A suitable reflection-enhancing material is, for example, a lustrous lacquer or aluminium, which is vapour-deposited, sputtered on or applied using any other suitable method. Additionally, those regions of the inner surface 13 which are not covered by the chip carrier part 2 and connection part 10 can also be provided with a reflection-enhancing layer as a result, these regions, too, reflect the radiation emitted by the semiconductor chip 1 in the intended main radiation direction 6. A lustrous lacquer or aluminium is also suitable for this purpose and may be applied by the methods mentioned above.

The recess 8 does not need to be completely filled up by the window part 9, but instead for only the semiconductor chip 1 and the trough 4 or any other desired partial region of the recess 8 to be surrounded or covered by the window part 9. Furthermore, the window part 9 can be produced in such a way that it projects beyond the upper edge of the recess 8.

In order to improve the heat dissipation from the semiconductor chip 1, it is possible, as shown in FIGS. 2a and 2b, for the external connections 11 of the chip carrier part 2 to be broader than the external connections 12 of the connection part 10. Though not shown, such a construction may also be possible with respect to the embodiments shown in FIGS. 1a–1c. If necessary (or possible), just one external connection 11 or a plurality of external connections 11 can be routed out of the encapsulation from the chip carrier part 2. The same applies to the connection part 10.

In a method for producing the inventive semiconductor component according to the first exemplary embodiment, it is possible, if the base body 7 is composed of a thermoplastic or another temperature-resistant material, for the lead frame to be encapsulated with the base body material and for the semiconductor chip and the bonding wire to be secured. Furthermore, recess 8 may be filled with the material of the window part 9.

The second exemplary embodiment shown in FIGS. 2a and 2b differs from the first exemplary embodiment only by the fact that the chip carrier part 2 is embedded in the base body 7 in such a way that the bottom wall 18 of the trough 4 projects from the base body on its underside. As a result, it is possible to make direct external contact with the chip carrier part 2, for example, by bonding or soldering it directly to a printed circuit board. Furthermore, in this exemplary embodiment the external connections 11 of the chip carrier part 2 have a greater width than the external connections 12 of the connection part 10. These measures, individually or in combination, ensure improved heat dissipation from the semiconductor chip 1.

All of the developments and refinements of the semiconductor component according to the invention which have been cited above with regard to the first exemplary embodiment can also be realized in the case of the second exemplary embodiment.

The third exemplary embodiment according to FIG. 3 differs from the previously mentioned first exemplary embodiment by the fact that the encapsulation 3 is produced completely from a radiation-permeable material, for example, a transparent synthetic resin. In this case, too, all of the refinements cited in connection with the first exemplary embodiment are conceivable.

The fourth exemplary embodiment has all of the features of the second exemplary embodiment except that the encapsulation is produced completely from a transparent material.

The above-described embodiments and exemplary embodiments of the semiconductor component according to the invention are not just restricted to the use of a radiation-emitting semiconductor chip 1, but also can be used for photodiode, phototransistor and other radiation-receiving semiconductor chips. The trough 4 is in this case designed in such a way that the radiation which is incident through the window part 9 is reflected in the direction of the semiconductor chip.

Although the present invention has been described with reference to specific embodiments, those of skill in the art will recognize that changes may be made without departing from the spirit and scope of the invention as set forth in the appended claims.

What is claimed is:

1. A surface mountable device, comprising:
   a lead frame;
   a chip carrier part;
   a semiconductor chip which performs at least one of a radiation-emitting and radiation-receiving function;
   a connection part positioned at a distance from the chip carrier part;
   a trough body positioned at the chip carrier part having a reflective inner surface;
   an encapsulation surrounding the semiconductor chip and at least a partial region of the chip carrier part wherein said chip carrier part projects from the encapsulation in the region of the trough body:
   said semiconductor chip being secured in said trough body on said chip carrier part and electrically connected to said connection part; and said chip carrier part being utilized for at least one of an electrical connection and a thermal connection.

2. A surface mountable device as claimed in claim 1, further comprising:

at least two external connections projecting from the encapsulation, said at least two external connections being directly connected to the connection part, said at least two external connections not being connected to the chip carrier part.

3. A surface mountable device as claimed in claim 1, further comprising:

at least two external connections protecting from the encapsulation, said at least two external connections being directly connected to the chip carrier part, said at least two external connections not being connected to the connection part.

4. A surface mountable device as claimed in claim 3, further comprising:

at least two further external connections projecting from the encapsulation, said at least two further external connections being directly connected to the connection part, said at least two further external connections not being connected to the chip carrier part.

5. A surface mountable device as claimed in claim 1, further comprising:

a reflection-enhancing material coated over at least a portion of the inner surface of the trough.

6. A surface mountable device as claimed in claim 1, wherein said encapsulation further comprises a base body having formed a recess therein and a radiation-permeable window arranged in the recess and wherein the semiconductor chip is positioned within the recess.

7. A surface mountable device as claimed in claim 6, wherein the recess having inner surfaces which are coated at least partially with reflection-enhancing material.

8. A surface mountable device as claimed in claim 1, wherein the encapsulation is formed completely of a radiation-permeable material.

9. A surface mountable device as claimed in claim 1, further comprising:

at least one external connection projecting from the encapsulation separate from the chip carrier part, said at least one external connection being directly connected to the chip carrier part, said at least one external connection not being connected to the connection part.

* * * * *

UNITED STATES PATENT AND TRADEMARK OFFICE
CERTIFICATE OF CORRECTION

PATENT NO. : 6,927,469 B2
DATED : August 9, 2005
INVENTOR(S) : Karlheinz Arndt et al.

It is certified that error appears in the above-identified patent and that said Letters Patent is hereby corrected as shown below:

Title page,
Item [54], Title, should read -- OPTOELECTRONIC SEMICONDUCTOR COMPONENT --.
Item [56], References Cited, U.S. PATENT DOCUMENTS, add:
-- 4,486,364     12/1984     Takahashi
   6,624,491 B2    9/2003     Waitl et al.
   6,645,783 B1    11/2003     Brunner et al. --.
FOREIGN PATENT DOCUMENTS, add:
-- DE   31 48 843 C2   1/1986
   EP   0 431 971 A2   6/1991 --.

Column 5,
Line 13, replace "protecting" with -- projecting --.

Signed and Sealed this

Fourth Day of April, 2006

JON W. DUDAS
*Director of the United States Patent and Trademark Office*